United States Patent [19]

Marinace

[11] 4,451,391
[45] May 29, 1984

[54] CONDUCTIVE SILICON CARBIDE

[75] Inventor: John C. Marinace, Yorktown Heights, N.Y.

[73] Assignee: International Business Machines Corporation, Armonk, N.Y.

[21] Appl. No.: 423,491

[22] Filed: Sep. 24, 1982

[51] Int. Cl.³ .............................................. H01B 1/06
[52] U.S. Cl. .................................. 252/512; 252/516; 427/85; 427/87
[58] Field of Search ....................... 252/512, 516, 502; 427/85, 87, 123, 126.1, 126.2; 428/426, 428, 430

[56] References Cited

U.S. PATENT DOCUMENTS

| | | | |
|---|---|---|---|
| 3,382,113 | 5/1968 | Ebert et al. | 148/175 |
| 3,386,866 | 6/1968 | Ebert et al. | 148/175 |
| 3,716,844 | 2/1973 | Brodsky | 340/173 LS |
| 4,042,447 | 8/1977 | Reitz | 252/501.1 X |
| 4,123,571 | 10/1978 | Balog et al. | 427/249 |
| 4,208,449 | 6/1980 | Knippenberg et al. | 427/101 |
| 4,265,991 | 5/1981 | Hirai et al. | 252/501.1 X |
| 4,289,822 | 9/1981 | Shimada et al. | 428/212 |

OTHER PUBLICATIONS

Phys. Stat. Sol. (b) 92, 99, (1979), "Vibrational Spectrum of Hydrogenated Amorphous Si–C Films", by H. Wieder, M. Cardona and C. R. Guarnieri.

IBM Technical Disclosure Bulletin, vol. 17, No. 10, Mar. 1975, p. 3096, "Thin Films of a Silicon Carbon Compound", by J. C. Marinace.

Philosophical Magazine, vol. 35, by D. A. Anderson et al., pp. 1–16.

IBM Technical Disclosure Bulletin, vol. 9, No. 10, Mar. 1967, pp. 1452–1455, "Capsule Diffusion Control Using Multicomponent . . . ", by Carlsen.

*Primary Examiner*—Josephine Barr
*Attorney, Agent, or Firm*—Alvin J. Riddles

[57] ABSTRACT

Silicon carbide material retains the hardness, wear and heat resistance properties and can be rendered conductive by the incorporation of an element of the same valence as silicon and carbon in quantities in the range of 0.01% to 0.03%. Germanium in this range in SiC is conductive. The material is very hard, is electrically conductive in the $2 \times 10^{-4}$ ohm cm range and is useful in highly corrosive and abrasive applications.

9 Claims, 2 Drawing Figures

CONDUCTIVE SILICON CARBIDE

DESCRIPTION

1. Technical Field

The technical field of the invention is that of wear resistant materials.

2. Background Art

The material silicon carbide (SiC) has been known for hardness properties, wear resistance and heat resistance. Silicon carbide is generally considered to be an insulator; however, there have been applications where through doping in quantities of less than 0.01 percent with elements of a different valence the silicon carbide performs as a semiconductor. Elements of a different valence are difficult to introduce. There have also been applications, as shown in U.S. Pat. No. 4,289,822, wherein with the addition of hydrogen, photoconversion properties have been imparted in silicon carbide. The presence of hydrogen essential to photo properties is detrimental to hardness, wear and heat resistance properties. Heretofore in the art, however, the material silicon carbide has not been known for both hardness, wear and heat resistance and for electrical conductivity.

DISCLOSURE OF THE INVENTION

Figure 1:
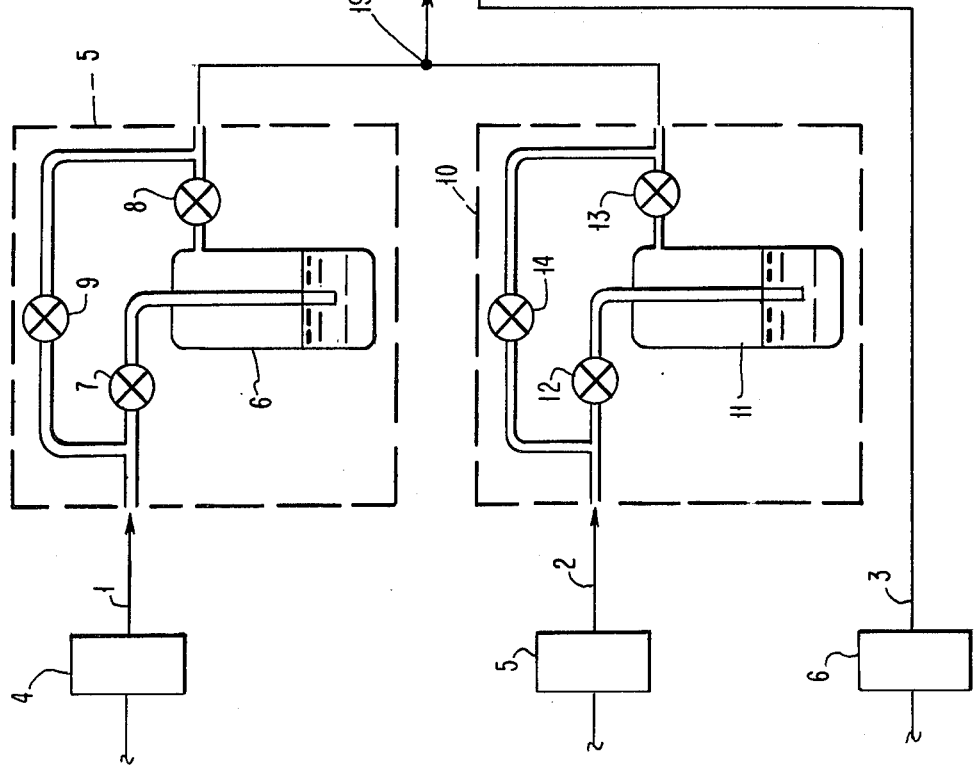
FIGS. 1 and 2 are an apparatus and associated temperature profile for introducing an element of the same valence into silicon carbide during pyrolytic growth.

It has been found that hydrogen free silicon carbide containing in excess of 0.01% of an element having the same valence as silicon and carbon exhibits electrical conductivity. The quantity 0.01% is higher than the quantities achievable by the techniques of diffusion and growth introduction employed in doping semiconductors.

Silicon carbide containing germanium in excess of 0.01% (SiC:Ge) exhibits all the hardness, wear resistance and heat resistance characteristics of silicon carbide and, in addition, exhibits electrical conductivity. The conductivity is of the order of $10^{-2}$ to $2\times10^{4}$ ohm-centimeters and the conductivity is dependent on concentration of germanium. The germanium is incorporated in amorphous silicon carbide and in beta or crystalline silicon carbide. Where the SiC is the beta or crystalline type, the germanium is considered to be included substitutionally in the lattice.

The element of the same valence as the silicon and carbon is preferably incorporated in the SiC by being introduced as an external element at the highest temperature in the system during pyrolytic vapor deposition.

At lower deposition temperatures, SiC:Ge is amorphous and above crystalization temperature SiC:Ge is a crystal.

The incorporation of the external element of the same valence as the silicon and carbon, such as Ge, at the highest temperature in the system also operates to exclude any hydrogen which is detrimental to the hardness, temperature resistance and electrical properties.

BEST MODE FOR CARRYING OUT THE INVENTION

Electrically conductive SiC containing Ge can preferably be formed through replacement of greater than 0.01% of the elements of the SiC by the chemical introduction of atoms of the same valence as the Si or the C, such as Ge as an external element during a pyrolytic vapor growth technique.

A known technique for forming silicon carbide is by growth on a substrate of the atomic products of pyrolytically decomposed trimethylsilane $(C_2H_5)_3SiH$, which serves as sources of both the silicon and the carbon.

In accordance with the invention, the element of the same valence can be introduced with improved control by introducing in gaseous form in a compound of one of the silicon or carbon ingredients. The resulting material retains the hardness, wear and heat resistance properties and consists only of silicon, carbon and the introduced same valence element within normal impurity tolerances. By diluting, for example, triethylsilane with a compound bearing the element to be introduced such as tetramethylgermanium $(CH_3)_4Ge$ which has a compatible vapor pressure and positioning the substrates on which the growth is to take place at the highest temperature point in the system, the growth will occur at the point where the gases dissociate and hydrogen will not be incorporated in the grown material. The hydrogen in the gaseous compounds upon dissociation does not react as well with silicon or germanium so that that hydrogen merely goes off or is combined with the carbon in the gaseous effluent. Further, to insure the absence of hydrogen, the carrier gas is preferably inert such as helium. The gases may be compounds of the ingredients or merely gaseous vehicles containing complexes, a single desired one of which deposits at the selected high temperature point.

The substrate is preferably of a material that is stable at the deposition temperatures such as quartz, sapphire, ceramic alumina, SiC, GaAs and metals melting above 800° C.

Where the mixed gases of $(C_2H_5)_3SiH$ and $(CH_3)_4Ge$ using helium as a carrier gas are decomposed over the substrates in the temperature range of 700°–750° C. there will be deposited conductive silicon carbide amorphous films on a substrate. Crystalline SiC:Ge can be formed at temperatures above 1100° C. If an amorphous layer is heated above 1100° C., it becomes crystalline of the beta silicon carbide form.

The conducting SiC-Ge films are most oftern ohmic exhibiting resistivities in the range of $10^{2}$ to $2\times10^{4}$ ohm cm. The quantity of Ge has been found to be up to the order of 0.03 weight fraction. In some films, a weak p-type semiconductor thermal electrical signal has been observed.

In substituting silicon, carbon and the external element sources in the process, there should be compatible vapor pressures of the gases.

A number of reaction materials are available to one skilled in the art. Triethylsilane $(C_2H_5)_3SiH$, has a boiling point of 107°–108° C. and a freezing point of 0° C., suggesting that the vapor pressure is similar to that of water. Tetramethylgermane, $(CH_3)_4Ge$, has a boiling point of 43.4° C. and a vapor pressure of 139 Torr at 0° C. Trimethylsilane, $(CH_3)_3SiH$, has a boiling point of 9° C. All of these materials are considered compatible and can be handled with relative ease and safety.

Figure 2:
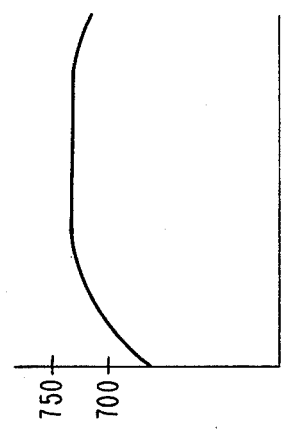

In order to assist one skilled in the art in appreciating the principles of the invention and to provide a starting place, the specifications of the growth of amorphous SiC:Ge are provided in connection with FIGS. 1 and 2.

The apparatus of FIG. 1 employs conventional materials consisting of quartz tubes and quartzware in the deposition furnace and employs pyrex in the external tubing and source bubblers. Carrier gas flow rates can be conveniently controlled by electronic mass-flow controllers well known in the art. There will be some variations in processing that will occur to one skilled in the art such as that trimethylgermanium and tetraethylsilicon could be mixed in one bubbler. Ordinarily, however, more flexibility of control is achieved by putting each in its own bubbler.

Referring to FIG. 1, the system has three flow paths, labelled 1, 2 and 3, each controlled by mass-flow controllers 4, 5 and 6. Paths 1 and 2 are to introduce the reacting element carrying gases and path 3 is to introduce a surrounding gas for control of leaks in paths 1 and 2.

In path 1, an element, the source stage 5, shown dotted consists of a bubbler 6, with input and output valves 7 and 8, and valved bypass 9. The bubblers are kept at temperatures according to the vapor pressure of the gas involved.

The bubbler 6 is usually maintained at room temperature, and it contains one of triethylsilane, trimethylsilane, tetraethylsilane and tetramethylsilane as examples, that serves as a source of the silicon and at least a part of the carbon.

In path 2, an external element source stage 10, shown dotted, includes a bubbler 11, provided with input and output valves 12 and 13, and valved bypass 14, respectively. In the bubbler 11, tetramethylgermanium is placed as the source of the external element and due to volatility is usually maintained at 0° C.

The path 3 contains helium as a surrounding gas. The gas in this path is usually at room temperature.

The gas flowing in the paths 1, 2 and 3 are introduced into a furnace section 15 in the dotted enclosure made up of concentric tubes 16 and 17, with an intersection 18. The gas flowing in paths 1 and 2 are combined at point 19 and then enter a first flow rate tube 20 and then through the intersection 18 into the central tube 17 in which are positioned the substrates 21. Surrounding the tube 17 is the external concentric surrounding tube 16. A smaller tube 22 of the carrier gas in path 3 feeds the tube 16.

Referring next to FIG. 2, a graph is shown illustrating the temperature profile to position the substrates 21 at the highest point where the gases decompose. The temperature in the region of the substrates 21 is such that the temperature is less than 700° C. slightly before the substrates 21, the substrates are maintained at 750° C. and the temperature drops slightly beyond. Should crystalline or beta SiC:Ge be desired, the profile would have 1100° C. as the highest point.

In growth specifications, the apparatus sizes, flow rates, gases involved and temperature are interrelated. The sizes of the gas tubing are set forth in Table 1.

TABLE 1

| Tube 20 | 23 millimeters inside diameter |
| Tube 16 | 55 millimeters inside diameter |
| Tube 17 | 30 millimeters inside diameter |
| Tube 22 | 8 millimeters inside diameter |

Typical flow rates are shown in Table 2 for durations of 4–16 hours to deposit thicknesses of from zero to several micrometers.

TABLE 2

| TYPICAL FLOW RATES | | |
|---|---|---|
| Path 1 | Path 2 | Path 3 |
| 200 | 100 | 100 |
| 200 | 20 | 100 |
| 10 | 100 (bubbler bypassed) | 100 |
| 20 | 100 (bubbler bypassed) | 100 |

The operation may be modified to use trimethylsilane and tetramethylgermanium mixed in the same container. This can be accomplished by replacing the bubbler 6 in stage 5 with the bypass 9 such as by closing valves 7 and 8 and opening the bypass valve and replacing the bubbler 11 in stage 10 with a bubbler containing the two liquid gas sources maintained at from 0° to 30° C. The flow rates for this arrangement are shown as Table 3 for a period of 5–17 hours to provide a thickness of from zero to several microns.

TABLE 3

| TYPICAL FLOW RATES | | |
|---|---|---|
| Path 1 | Path 2 | Path 3 |
| 100 ml min | 50 | 100 |
| 100 | 50 (0° C.) | 100 |

What has been described is the introduction of Ge into pyrolytically grown SiC to impart electrical conductivity.

Having thus described our invention, what we claim as new and desire to secure by Letters Patent is:

1. A body of electrically conductive material consisting only of silicon, carbon and the element germanium in a range between 0.01% and 0.03%.

2. The material of claim 1 wherein said body is in amorphous form.

3. The material of claim 1 wherein said body is in crystalline form.

4. An electrically conductive material consisting of hydrogen free silicon carbide containing in the range of 0.01 to 0.03 percent germanium.

5. A hydrogen free electrically conductive product of silicon carbide consisting of silicon, carbon and the element germanium in the range of 0.01 to 0.03% made by the process of pyrolytically dissociating an organic silicon and carbon bearing gas selected from the group consisting of triethylsilane, trimethylsilane, tetraethylsilane and tetramethylsilane and an organic germanium bearing gas of tetraethylgermanium in a proportion of two parts silicon and carbon bearing gas to one part germanium bearing gas over a substrate taken from the group of quartz, sapphire, ceramic alumina, silicn carbide, gallium arsenide and metals melting above 800° C., positioned at the highest temperature point in the flow of the said gases whereby said product is deposited on said substrate.

6. The product of claim 5 wherein said deposited product is in amorphous form.

7. The product of claim 5 wherein said deposited product is in crystalline form.

8. The process of forming a growth of Sic containing in the range of 0.01% to 0.03% of germanium on a substrate taken from the group of quartz, sapphire, ceramic alumina, silicon carbide, gallium arsenide and metals melting above 800° C. comprising in combination the steps of:

provide a first pyrolytically decomposable gaseous vehicle of at least one organic gas containing silicon and carbon selected from the group consisting of triethylsilane, trimethylsilane, tetraethylsilane and tetramethylsilane, flowing over said substrate, providing a second pyrolytically decomposable gaseous vehicle of tetraethylgermanium, mixing said first and said second gaseous vehicles a proportion of two parts of said silicon and carbon bearing gas to one part of said germanium bearing gas in contact with said substrate, and heating said substrate to a temperature higher than all surrounding temperatures, said temperature being the highest temperature required for the pyrolytic decomposition of said first and said second gaseous vehicles.

9. The process of claim 8 wherein said temperature is 750° C.

* * * * *

UNITED STATES PATENT AND TRADEMARK OFFICE
CERTIFICATE OF CORRECTION

PATENT NO. : 4,451,391
DATED : May 29, 1984
INVENTOR(S) : John C. Marinace

It is certified that error appears in the above-identified patent and that said Letters Patent are hereby corrected as shown below:

Column 1, line 43, "$2x10^{31\ 4}$" should read --$2x10^{-4}$--.

Column 1, line 51, "Sic" should read --SiC--.

Column 1, line 54, "depostion" should read --deposition--.

Column 2, line 44, "oftern" should read --often--.

Column 2, line 45, "$10^{31\ 2}$ to $2x10^{31\ 4}$" should read --$10^{-2}$ to $2x10^{-4}$--.

Column 4, line 37, "A body of" should read --An--.

Column 4, line 66, "Sic" should read --SiC--.

Signed and Sealed this

Nineteenth Day of February 1985

[SEAL]

*Attest:*

DONALD J. QUIGG

*Attesting Officer*     *Acting Commissioner of Patents and Trademarks*